United States Patent

[11] 3,615,954

[72] Inventor Max C. Kennison
Cleveland, Ohio

[21] Appl. No. 673,070
[22] Filed Oct. 5, 1967
[45] Patented Oct. 26, 1971

[73] Assignee Ortec, Incorporated
Oak Ridge, Tenn.

[54] TREATMENT OF SMALL SEMICONDUCT OR WAFERS WITH ETCHANT
2 Claims, 5 Drawing Figs.

[52] U.S. Cl. .......... 156/17, 156/345, 134/25, 134/117, 118/504
[51] Int. Cl. .......... H01l 7/50, C23g 1/02
[50] Field of Search .......... 156/17, 345; 118/500, 504; 134/137, 117, 155, 25

[56] References Cited

UNITED STATES PATENTS

| | | | |
|---|---|---|---|
| 2,849,296 | 8/1958 | Certa | 156/17 |
| 3,035,959 | 5/1962 | Wang | 156/17 |
| 3,320,105 | 5/1967 | Brevik | 156/345 X |

*Primary Examiner*—Jacob H. Steinberg
*Attorney*—Brumbaugh, Graves, Donohue & Raymond

ABSTRACT: A hollow, rigid sphere having a multiplicity of holes therein is formed in two separable hemispheres. A disk-shaped semiconductor wafer is enclosed within the sphere, and the sphere is inserted in a vessel containing an etching liquid. The sphere prevents the wafer from floating on the surface of the liquid or adhering to the walls or bottom of the vessel. The flat faces of the wafer are maintained out of contact with the sphere and are subjected to uniform treatment by the liquid.

INVENTOR.
MAX C. KENNISON
BY
Brumbaugh, Free, Graves & Donohue
his ATTORNEYS

TREATMENT OF SMALL SEMICONDUCT OR WAFERS WITH ETCHANT

BACKGROUND OF THE INVENTION

This invention relates to the treatment of small objects by exposure to a fluid and, more particularly, to a novel and highly effective method and means facilitating uniform treatment of all parts of a major portion of the surface of small objects.

The treatment of a wide variety of objects, both large and small, by exposure to a fluid is an essential part of many industrial and scientific processes. In the treatment of small objects, a serious problem arises from the difficulty of subjecting all parts of interest of the surface of the object to an equal degree of treatment.

To cite one example from a field of increasing importance, it is extremely difficult to subject thin semiconductor wafers to equal treatment on both of the flat circular faces thereof during an etching or quenching process or other similar process necessary during the manufacture of the finished semiconductor device.

An important reason for the difficulty encountered is that very thin semiconductor wafers exhibit a tendency to seek out a boundary of the liquid in which they are immersed. For example, a thin semiconductor wafer on the surface of an etching liquid tends to remain on the surface because of surface tension, attached bubbles, or both. On the other hand, if the wafer finds itself below the surface of the liquid, it tends to sink to the bottom of the vessel containing the liquid, because its specific gravity is greater than that of the liquid.

Thus, whether the wafer floats or sinks, one of the flat circular faces thereof is subjected to treatment by the liquid to a greater extent than the other. Specifically, in the case of a floating wafer, the lower surface is treated to a greater extent than the upper surface, whereas, in the event of a wafer resting on the bottom of the vessel in which it and the fluid are contained, the upper surface of the wafer is treated by the liquid to a greater extent than the lower surface of the wafer is treated.

Various means, none very successful, have been employed in an effort to overcome the difficulties noted above. For example, a floating semiconductor wafer can be manually pushed beneath the surface, and the vessel within which the fluid and wafer are contained can be agitated in order to expose the lower surface of a wafer resting on the bottom of the vessel to treatment by the fluid.

There are serious deficiencies in the expedients that have been heretofore.

A first deficiency in the prior art method is that, although a semiconductor wafer floating on the surface of the treating fluid can be forced beneath the surface, some degree of damage has already been done, and the imbalance between the treatments accorded the two sides of the wafer is not eliminated. Similarly, agitation of the vessel does not necessarily result in equal treatment of both sides of the wafer.

Moreover, these expedients involve serious risk of damage to the semiconductor wafers. Even slight contact of the wafer with the tool of an operator or the edge of another wafer can be expected to render the wafer unusable in applications such as radiation detection.

SUMMARY OF THE INVENTION

An object of the invention is to remedy the problems pointed out above. In particular, an object of the invention is to provide for the positive immersion of small solid objects such as semiconductor wafers in a fluid for treatment while maintaining all parts of a major portion of the surface of the object substantially equally exposed to the treating fluid and to do so in a manner which produces a minimum strain and subsequent risk of mechanical damage to the object.

The foregoing and other objects of the invention are attained, in accordance with a representative embodiment of the invention, by enclosing the object in a hollow, rigid holder having an interior surface for supporting the object. The relation of the interior surface to a major portion of the surface of the object is one of relative concavity, so that only a minor portion of the surface of the object can come into contact with the interior surface. The major portion of the surface of the object is maintained permanently out of contact with the interior surface. The holder is immersed in the treating fluid, and the holder prevents the object from migrating to a boundary of the fluid. At the same time, the holder allows the fluid to penetrate therethrough and gain access to the object and effect uniform treatment of all parts of interest of the surface of the object.

BRIEF DESCRIPTION OF THE DRAWING

An understanding of additional aspects of the invention may be gained from a consideration of the following detailed description of preferred embodiments of the method and apparatus of the invention in conjunction with the accompanying figures of the drawing, in which.

DESCRIPTION OF THE PREFERRED EMBODIMENTS

Figure 1:
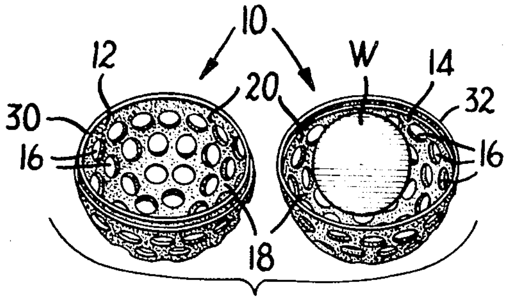
FIG. 1 is a perspective view of an exemplary holder constructed in accordance with the invention and in an open condition.

FIG. 1 shows a holder 10 constructed in accordance with the invention. The holder 10 is formed in two hemispheres 12 and 14. Each of the hemispheres is provided with a multiplicity of small round holes 16 through which a fluid such as an etching or quenching liquid can readily pass.

Figure 2:
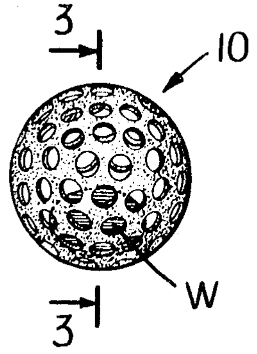
FIG. 2 is a perspective view of the holder in a closed condition.

An object *w* such as a semiconductor wafer to be treated is sufficiently large, however, that it cannot pass through the holes 16 and can be inserted within and removed from a cavity 18 defined by the interior surface 20 of the holder 10 only when the holder 10 is in the opened condition of FIG. 1. As FIG. 2 shows, when the holder 10 is in the closed condition, the wafer *w* cannot be removed therefrom.

Figures 3, 4, 5:
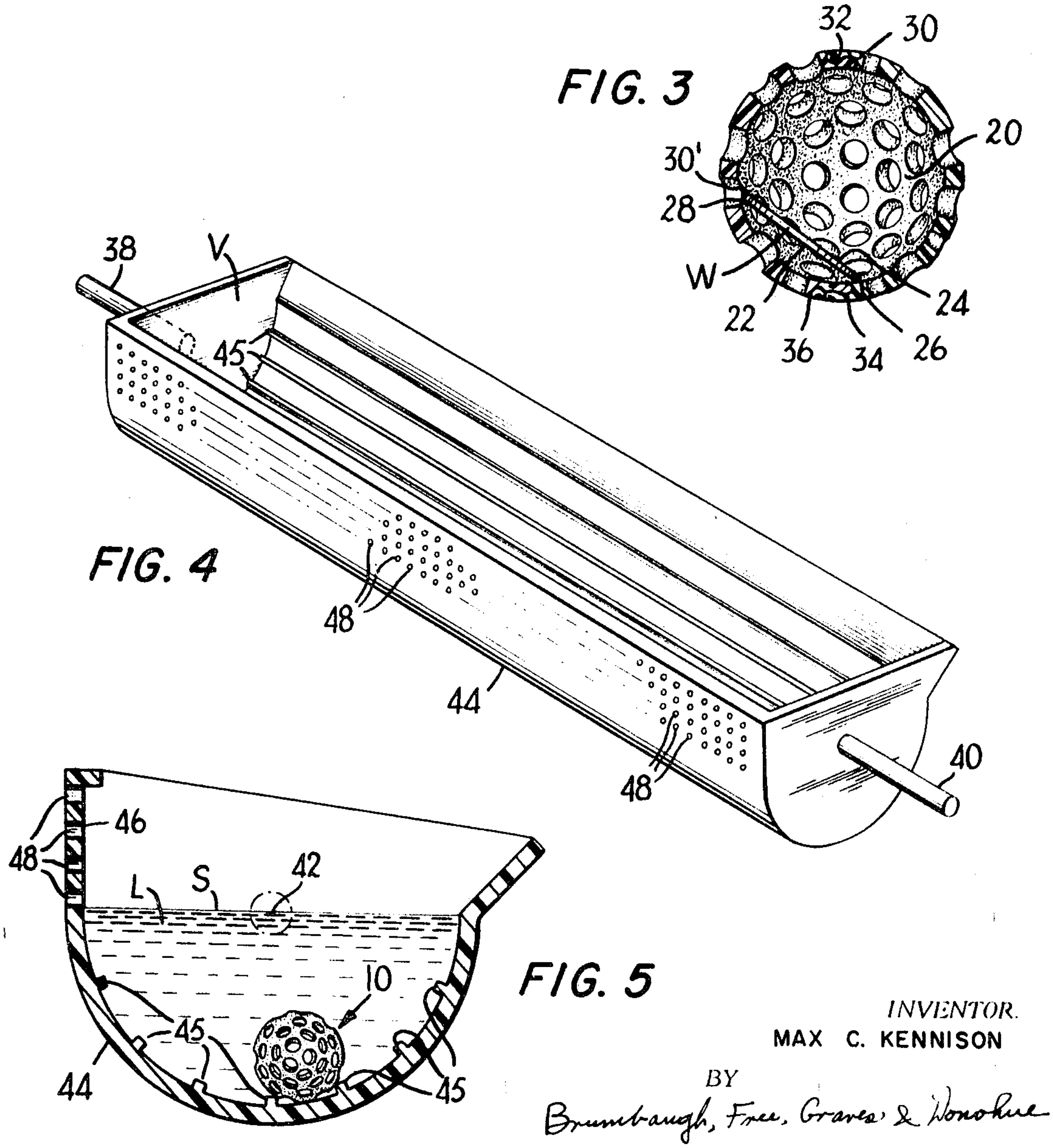
FIG. 3 is a sectional view taken generally along the line 3—3 of FIG. 2.
FIG. 4 is a perspective view of a vessel for containing the holder and a treating fluid.
FIG. 5 is a sectional view in elevation of the vessel of FIG. 4 with the holder of FIGS. 1–3 in place.

FIG. 3 shows the manner in which the wafer *w* is supported by the interior surface 20. The wafer *w* has two oppositely facing flat circular faces 22 and 24, respectively, and a cylindrical circumferential wall 26. The flat circular face 22 and the cylindrical circumferential wall 26 meet in a circle of intersection 28, and the circumferential cylindrical wall 26 and the flat circular surface 24 meet in a circular line of intersection 30'.

The surfaces 22 and 24 constitute a major portion of the surface of the semiconductor wafer *w*, and it is such portion which is the primary subject of interest. Specifically, it is desired that both of these surfaces be equally treated by a treating fluid.

In accordance with the present invention, these surfaces are equally exposed at all times to the treating fluid. The interior wall 20 of the cavity 18 is spherical. More generally, it presents a surface to the surfaces 22 and 24 which is relatively concave. This means that the surfaces 22 and 24 are maintained permanently out of contact with the surface 20.

The diameter of the cavity 18 is greater than the diameter of the semiconductor wafer *w* to allow limited movement of the semiconductor wafer *w*. In general, the interior cavity 18, when the holder 10 is adjusted to the closed condition, has a size so proportioned to the size of the wafer *w* or other object to be treated that treated that the holder restrains the object without immobilizing the object.

In many applications, the material from which the holder is constructed is important. Polytetrafluoroethylene, sold by E. I. DuPont de Nemours & Company under the trademark "-

Teflon," is well suited for use in the etching and quenching of semiconductor wafers.

In operation, a semiconductor wafer is inserted into one of the hemispheres, such as the hemisphere 14, as shown in FIG. 1. The hemispheres are then united into a sphere by manually applied pressure. As FIGS. 1 and 3 show, the hemisphere 12 is provided with an outwardly projecting interior lip 30, and the hemisphere 14 is provided with an outwardly projecting exterior lip 32. The lip 30 has a protuberance 34 complemental to a protuberance 36 formed on the lip 32, as FIG. 3 best shows. When the lips 30 and 32 are pushed together, the protuberances 34 and 36 ride one over the other and form a lock in the position of FIG. 3. The two hemispheres can be disengaged from each other by manually pulling them apart.

The assembled holder 10 with the wafer *w* contained therein is inserted in a suitable vessel *v* which may be of the type shown, for example, in FIG. 4.

The vessel *v* is provided with rods 38 and 40 suitably attached, as by welding, to opposite ends thereof. The location of the rods 38 and 40 is at the origin 42 (FIG. 5) of a semicircle described by a section in FIG. 5 of the wall 44 of the vessel *v*. The rods 38 and 40 provide support for the vessel *v* and also permit rotation thereof about its longitudinal axis.

The vessel *v* is also provided with longitudinally extending ribs 45 which facilitate agitation of a liquid L contained within the vessel and also facilitate agitation of the holder 10. A drain board 46 is provided with holes 48 to provide necessary drainage.

When the holder 10 is inserted within the vessel *v* as shown in FIG. 5, it prevents the wafer *w* from migrating to or seeking out a boundary of the liquid. Specifically, it prevents the wafer *w* from floating on the surface *s* of the liquid L and also prevents the wafer from coming to rest anywhere on the wall 44. Further, it protects the wafer from damage by the ribs 45. At the same time, the treating liquid passes freely through the holes 16 and treats both faces 22 and 24 of the wafer. In fact, even the cylindrical surface 26 is subjected to treatment by the liquid L, only the lines of intersection 28 and 30', which have a negligible area, being in contact with the interior surface 20 of the cavity 18. The holes 16 are substantially equally spaced apart, so that the orientation of the holder 10 is of no consequence so far as the uniformity of the treatment is concerned.

The vessel *v* may advantageously be formed of the same material as the holder 10; i.e., in the example given, polytetrafluoroethylene. One or a number of such vessels may be provided to facilitate treatment of the wafer *w* by a number of fluids.

The holder 10 may be inserted into a large cylindrical body (not shown) of etching or other solution instead of into the vessel *v*. The required agitation and stirring are then produced by placing the cylindrical body on an orbital shaker similar to those used in many chemical laboratories.

Alternatively, the holder 10 may be permitted to fall through a tube (not shown) of solution, the rate of fall being controlled by such factors as the slope of the tube and the clearance between the holder 10 and the wall of the tube. This technique is particularly adapted to continuous processes.

Thus, there is provided in accordance with the invention novel and highly effective means whereby very thin and uniform semiconductor slices can be generated. In accordance with the invention, the wafer is loosely restrained without being immobilized; within a limited space, it is allowed free movement in a highly turbulent chemical solution. The holder is so constructed that the faces of the semiconductor slice do not come in contact therewith and the turbulence of the solution does not cause breakage of or other damage to the thin semiconductor slice, even when a large number of such slices are processed in separate holders in the same vessel simultaneously. Variations in surfaces due to differences in skills of technicians are thus reduced, and the treating process is rendered more economical by reducing the skill required to obtain a surface of the requisite degree of perfection. The holder and vessel do not react with any of the solutions employed.

The invention facilitates the routine production of optically flat (to within a few light bands) silicon semiconductor wafers having opposite parallel surfaces, even in cases where the wafers are as thin as 6 μmeters and have a diameter of 1 cm. Following the etching operation, the wafers must also survive numerous rinses, chemical surface treatments, and other treatments, for which the holder of the invention is also used. For very thin wafers, the use of the holder of the invention reduces the loss due to breakage, etc., from virtually 100 percent to a very small fraction.

Those skilled in the art will understand that many modifications of the representative embodiments described above are possible within the spirit and scope of the invention. For example, while the invention has been described as applied to the treatment of a semiconductor wafer, it has great utility in any process where it is desired to treat a large number of small parts simultaneously but where it is essential that the parts be uniformly treated and not be in contact with one another. Further, objects having shapes other than the disk shape illustrated for the semiconductor wafer *w* can be treated in accordance with the invention. For example, if the surfaces 22 and 24 are convex, the wafer *w* can still be treated satisfactorily in the holder 10 provided the radius of curvature of such surfaces is greater than the radius of curvature of the surface 20; or, more generally, provided the degree of convexity of the surfaces 22 and 24 does not exceed the degree of concavity of the surface 20. In other words, the desired relationship is one in which the interior cavity 20 is relatively concave as referred to the surfaces 22 and 24.

Accordingly, the invention is to be construed as extending to all embodiments thereof within the scope of the appended claims.

I claim:

1. A method of treating a plurality of semiconductor wafers with a fluid in a vessel comprising the steps of providing at least one hollow perforated sphere that can be opened and closed, enclosing one semiconductor wafer at a time within said hollow sphere, and submerging the sphere in the fluid in the vessel, the diameter of the sphere being larger than the diameters of the semiconductor wafers so that the semiconductor wafers have limited freedom of movement within the sphere but small enough in relation to the diameters of the semiconductor wafers that the major surfaces of the semiconductor wafers cannot touch the sphere, the sphere holding the semiconductor wafers away from the walls of the vessel and away from the surface of the fluid and the fluid entering the sphere by virtue of its perforated structure to treat said major surfaces substantially uniformly.

2. Apparatus for uniformly treating the circular flat surfaces of a disk-shaped semiconductor wafer comprising the combination of a hollow holder having a spherical interior shape for receiving the wafer and a vessel for receiving the holder and a treating liquid, the holder comprising two detachable hemispheres and being formed with holes through which the treating liquid can readily pass and adapted to receive a single disk-shaped semiconductor wafer at a time, the vessel being turnable on an axis and formed with rib means to facilitate agitation of the treating liquid and holder when the holder is submerged in the treating liquid, and the circular flat surfaces of the wafer being unable to touch the holder because of the spherical shape of said interior and being substantially uniformly exposed to the treating liquid, irrespective of the degree of said agitation.

* * * * *